(12) United States Patent
Juntunen et al.

(10) Patent No.: US 10,950,737 B2
(45) Date of Patent: Mar. 16, 2021

(54) SEMICONDUCTOR STRUCTURES AND MANUFACTURING THE SAME

(71) Applicant: ELFYS OY, Espoo (FI)

(72) Inventors: Mikko Juntunen, Kirkkonummi (FI); Hele Savin, Espoo (FI); Ville Vähänissi, Vantaa (FI); Päivikki Repo, Vantaa (FI); Juha Heinonen, Espoo (FI)

(73) Assignee: ELFYS OY, Espoo (FI)

( * ) Notice: Subject to any disclaimer, the term of this patent is extended or adjusted under 35 U.S.C. 154(b) by 20 days.

(21) Appl. No.: 16/486,280

(22) PCT Filed: Feb. 13, 2018

(86) PCT No.: PCT/FI2018/050099
§ 371 (c)(1),
(2) Date: Aug. 15, 2019

(87) PCT Pub. No.: WO2018/150088
PCT Pub. Date: Aug. 23, 2018

(65) Prior Publication Data
US 2019/0386157 A1    Dec. 19, 2019

(30) Foreign Application Priority Data
Feb. 15, 2017   (FI) .................................. 20175123

(51) Int. Cl.
*H01L 31/0216*   (2014.01)
*H01L 31/0236*   (2006.01)
(Continued)

(52) U.S. Cl.
CPC ...... *H01L 31/02161* (2013.01); *H01L 31/028* (2013.01); *H01L 31/02363* (2013.01);
(Continued)

(58) Field of Classification Search
None
See application file for complete search history.

(56) References Cited

U.S. PATENT DOCUMENTS 3,911,465 A * 10/1975 Foss .................... H01L 31/1133
                                                          257/290
4,090,213 A *  5/1978 Maserjian ............ H01L 31/062
                                                          136/255
(Continued)

FOREIGN PATENT DOCUMENTS

CN          1053512 A       7/1991
EP        2 339 642 A2      6/2011
(Continued)

OTHER PUBLICATIONS

International Search Report and Written Opinion for Application No. PCT/FI2018/050099 dated Jun. 15, 2018, 16 pages.
(Continued)

*Primary Examiner* — Khaja Ahmad
(74) *Attorney, Agent, or Firm* — Alston & Bird LLP

(57) ABSTRACT

A layered semiconductor structure with a width in a lateral direction, having an operating area covering part of the width of the semiconductor structure, comprises a semiconductor substrate with majority charge carriers of a first polarity; and a first dielectric layer with inducing net charge of the first polarity on the semiconductor substrate. An induced junction is induced in the semiconductor substrate by an electric field generated in the semiconductor substrate by the inducing net charge. The semiconductor structure is configured to confine the electric field generated in the semiconductor substrate in the operating area.

13 Claims, 4 Drawing Sheets

(51) Int. Cl.
*H01L 31/028* (2006.01)
*H01L 31/103* (2006.01)
*H01L 31/18* (2006.01)
*H01L 31/074* (2012.01)

(52) U.S. Cl.
CPC ........ *H01L 31/103* (2013.01); *H01L 31/1804* (2013.01); *H01L 31/074* (2013.01)

(56) References Cited

U.S. PATENT DOCUMENTS

| | | | |
|---|---|---|---|
| 4,435,610 A | | 3/1984 | Perlman et al. |
| 9,882,070 B2 | | 1/2018 | Junteunen et al. |
| 2002/0000244 A1 | * | 1/2002 | Zaidi ............... H01L 31/1804 136/259 |
| 2008/0116454 A1 | * | 5/2008 | Shimizu ............ H01L 31/1836 257/43 |
| 2010/0015749 A1 | | 1/2010 | Borden |
| 2012/0048376 A1 | * | 3/2012 | Gilman ............ H01L 31/02167 136/261 |
| 2015/0162487 A1 | * | 6/2015 | Deshazer ......... H01L 31/02167 438/57 |
| 2015/0206917 A1 | | 7/2015 | Chin et al. |
| 2016/0240703 A1 | * | 8/2016 | Davidsen ............ H01L 31/186 |
| 2017/0358694 A1 | | 12/2017 | Junteunen et al. |

FOREIGN PATENT DOCUMENTS

| | | |
|---|---|---|
| FR | 2230086 A1 | 12/1974 |
| JP | H0442973 A | 2/1992 |
| WO | WO 2017/016789 A1 | 2/2017 |

OTHER PUBLICATIONS

Search Report for Finnish Application No. 20175123 dated Sep. 27, 2017, 2 pages.
Donsberg, T. et al., *Predictable Quantum Efficient Detector Based on η-type Silicon Photodiodes*, Metrologia 54 (201) 821-836.
Heinonen, J. et al., *Black Silicon n-type Photodiodes With High Responsive Over Wide Spectral Range*, Optical Sensors 2017, Proceedings of SPIE, vol. 10231 (2018) 6 pages.
Juntunen, M. A. et al., *Near-Unity Quantum Efficiency of Broadband Black Silicon Photodiodes with an Induced Junction*, Nature Photonics, vol. 10 (Nov. 14, 2016) 777-781.
Savin, H. et al., *Black Silicon Solar Cells With Interdigitated Back-Contacts Achieve 22.1% Efficiency*, Nature Nanotechnology 10 (2015) 624-628.
Sildoja, M. et al., *Predictable Quantum Efficient Detector: I. Photodiodes and Predicted Responsivity*, Metrologia 50 (2013) 385-394.
Valluru, D., *Surface Passivated Black Silicon Photodetectors with Induced Junction*; Master's Thesis, Aalto University Learning Center, Finland (Jun. 10, 2015) 55 pages.
Von Gastrow, G. et al., *Analysis of the Atomic Layer Deposited $Al_2O_3$ Field-Effect Passivation in Black Silicon*, Solar Energy Materials & Solar Cells 142 (2015) 29-33.

\* cited by examiner

400

PROVIDING A SEMICONDUCTOR SUBSTRATE, HAVING AN OPERATING AREA, WITH MAJORITY CHARGE CARRIERS OF A FIRST POLARITY — 401

FORMING, ON THE SEMICONDUCTOR SUBSTRATE, OUTSIDE THE OPERATING AREA, A SECOND DIELECTRIC LAYER WITH A COMPENSATING NET CHARGE OF A SECOND POLARITY OPPOSITE TO THE FIRST POLARITY — 402

FORMING, ON THE SEMICONDUCTOR SUBSTRATE, A FIRST DIELECTRIC LAYER, EXTENDING FROM THE OPERATING AREA OUTSIDE THEREOF, WITH INDUCING NET CHARGE OF THE FIRST POLARITY — 403

Fig. 4

SEMICONDUCTOR STRUCTURES AND MANUFACTURING THE SAME

CROSS-REFERENCE TO RELATED APPLICATIONS

This application is a national phase entry of International Application No. PCT/FI2018/050099, filed Feb. 13, 2018, which claims priority to Finnish Patent Application No. 20175123, filed on Feb. 15, 2017, the entire contents of which are incorporated herein by reference.

BACKGROUND

Various types of semiconductor photodetectors such as photodiodes are widely used in different light sensing applications, for example, in imaging and non-imaging light sensing systems for medical, security, and industrial applications.

Typically, a semiconductor photodetector comprises a photodiode based on a p-n junction. A p-n junction is commonly formed by implanting foreign impurities on a semiconductor substrate surface, i.e. impurities of different conductivity type than the semiconductor substrate, and annealing the implanted region.

As an alternative approach, instead of a conventional p-n junction, photodetectors have been proposed which are based on an induced junction. An induced junction may be created in a structure comprising a semiconductor substrate and a dielectric layer with a fixed net charge on the semiconductor substrate. With sufficiently high fixed net charge of the same polarity as the majority carriers of the substrate, an inversion layer may be created close to the surface of the substrate, separated from the bulk of the substrate by a depletion region. This may effectively result in a p-n type junction formed between the inversion layer and the bulk of the substrate. For example, Juntunen et al reported photodetectors based on induced junction created by a dielectric layer of $Al_2O_3$ on an n-type Si substrate in "*Near-unity quantum efficiency of broadband black silicon photodiodes with an induced junction*", Nature Photonics 10, 777-781 (2016).

In addition to photodetectors, an inversion layer and a depletion region induced by external fixed net charge of a dielectric layer may be utilized in other types of semiconductors structures and devices, such as diodes and transistors.

Usually, a semiconductor structure with an induced junction has an operating area in which the induced junction is to be utilized. On the other hand, outside such operating area, the effects of the induced junction are typically undesirable. For example, for photodetectors utilizing an induced junction, various guard rings and other types of "channel stopping" structures have been proposed for cutting off the horizontal channel formed by the inversion layer outside the active area of the photodetector. However, prior art channel stopping structures are non-ideal and may also require additional processing steps.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one aspect, a semiconductor structure is disclosed which has a width, and an operating area partially covering that width, the semiconductor structure comprising: a semiconductor substrate with majority charge carriers of a first polarity; and a first dielectric layer with inducing net charge of the first polarity on the semiconductor substrate. Thereby, an induced junction with an inversion layer and a depletion region is induced in the semiconductor substrate by an electric field generated in the semiconductor substrate by the inducing net charge. Advantageously, the photodetector structure is configured to confine the electric field generated in the semiconductor substrate in the operating area.

The semiconductor structure may be implemented, for example, as various types of semiconductor photodetectors. Such photodetectors may be used in various medical, security, and industrial applications. Photodetectors may be utilized, for example, in camera image sensors, illuminometers and shutter controls, imaging and X-ray imaging systems, smoke detectors, twilight detectors, fiber optic links, position sensors, computed tomography (CT) systems, or photovoltaic/solar cells. In general, a photodetector may be used in any imaging or non-imaging light sensing or light energy collecting device or system.

On the other hand, the semiconductor structure may be used in any other appropriate semiconductor device utilizing an inversion layer induced in a semiconductor substrate by net charge of a dielectric layer on the semiconductor substrate. Such semiconductor device may be, for example, a diode or a transistor, or a micro circuit of any other appropriate type.

In another aspect, a manufacturing method is disclosed which may be used for manufacturing a semiconductor structure as discussed above.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein:

FIG. 4 illustrates a flow chart of a method for manufacturing a semiconductor structure.

The drawings of the FIGS. 1 to 3 and 5 are not in scale.

DETAILED DESCRIPTION

The detailed description provided below in connection with the appended drawings is intended as a description of a number of embodiments and is not intended to represent the only forms in which the embodiments may be constructed, implemented, or utilized.

Figure 1:
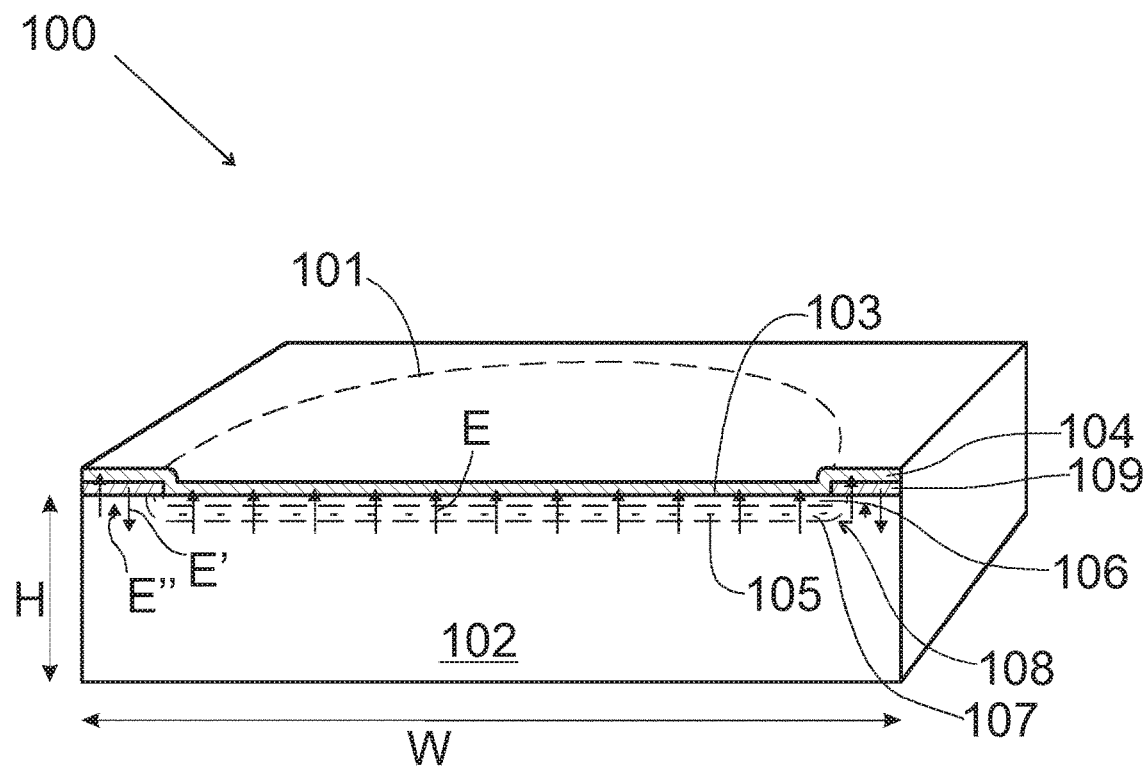
FIGS. 1 and 2 illustrate schematic, sectional perspective views of semiconductor structures.

The layered semiconductor structure 100 is formed as sheet-like structure having, at the location of the cross section illustrated in FIG. 1, a width of W. This width, and the lateral dimensions in general are substantially greater than the thickness H of the semiconductor substrate. However, the accurate relationship between the lateral dimensions and the thickness may vary in different embodiments.

Also the absolute width may vary, depending on the embodiment and the field of application of the semiconductor structure, and may lie, for example, in the range of some hundreds of micrometers to several centimeters.

The semiconductor structure 100 may be implemented as a discrete structure for a discrete semiconductor device, element, or component, in which case the width thereof may cover the entire lateral extent of such device, element, or component. In other embodiments, a semiconductor substrate may form an integral structure of a larger semiconductor assembly, for example, an array of semiconductor structures.

"Semiconductor structure" refers to a structure which may comprise all or only part of structural parts, layers, and elements of a complete, operational semiconductor component, element, or device such as a photodetector. In the case of forming only a part of such component, element, or device, the term "structure" may thus be considered as a structure "for", or a building block of, such component, element, or device.

The semiconductor structure 100 of FIG. 1 may be implemented, for example, as a photodetector structure. A "photodetector structure" refers to a structure which may form a part of, or form completely, a photodetector. Thus, a complete, operable photodetector may comprise layers and structures additional to the photodetector structure. On the other hand, a photodetector structure may alternatively comprise all essential parts of an operable photodetector.

A "photodetector", in turn, refers to a semiconductor component capable of converting incident light energy, absorbed in the photodetector, into electric signal(s) and/or electrical energy (photovoltaic/solar cells). The primary purpose of a photodetector may be sensing of light or collecting and converting light energy into electrical energy. "Light" refers to ultraviolet, visible, and infrared regions of the electromagnetic spectrum. In addition to direct detection of incident light, a photodetector may be also used, as such or in connection with a scintillator, to detect ionizing radiation such as, for example, X-rays.

A "photodetector" may be a complete, stand-alone light sensing component. Alternatively, it may form an integral part of a larger detector assembly, such as an array of photodetector elements. For example, a plurality of photodetectors or photodetector elements may be arranged to form a sensor where each photodetector or photodetector element forms one pixel of the sensor.

In other embodiments, semiconductor structures basically in accordance with that of FIG. 1 may be implemented, for example, as a diode or a transistor, or as any appropriate type of microcircuit utilizing an inversion layer.

The semiconductor structure 100 of FIG. 1 is substantially rectangular in the lateral direction, the cross section illustrated in FIG. 1 being cut at a center line of semiconductor structure. The drawing of FIG. 1 thus shows half of the entire semiconductor structure.

The semiconductor structure 100 has an operating area 101 marked in the drawing of FIG. 1 by a dashed line. An "area" refers to a region or zone observed, or defined, in the lateral direction of the semiconductor structure.

In the example of FIG. 1, the operating area 101 is positioned substantially centrally in the semiconductor substrate, and it is substantially circular. In other embodiments, operating areas with different shapes and/or positioned differently may be used. In some embodiments, a semiconductor structure may have more than one operating area.

"An operating area" refers to a specific area, observed in the lateral direction or plane in which the semiconductor structure has its width, specifically configured to serve as an area where the main functions of the semiconductor structure, utilizing the semiconducting properties thereof, is designed to take place. Such main functions may comprise, for example, detecting light by a junction between semiconductor regions with different conductivity types or polarities of the charge carriers. Thus, in the case of a photodetector structure, the operating area may form an active area for receiving and absorbing light to be detected. In other embodiments, such main functions may comprise, for example, serving as a current channel. As discussed below, in the example of FIG. 1, an induced junction is utilized for such main functions.

On the other hand, a specific "operating area" covering only a part of the width of a semiconductor structure refers to such main functions being designed not to take place, and/or the specific semiconducting properties on which they are based not to have any specific effects, outside the operating area.

The layered semiconductor structure 100 of FIG. 1 comprises a semiconductor substrate 102 with majority charge carriers of a first polarity.

A semiconductor "substrate" refers to a substrate layer or a base layer formed of a semiconductor material which may be an elemental semiconductor or a compound semiconductor.

"Polarity" refers to the positive or negative nature of the charge carriers of the semiconductor material, i.e. electrons or holes, whereby the polarity is of n-type (conductivity) or p-type (conductivity), respectively.

The first polarity may be either of n-type or p-type. In an embodiment, the semiconductor substrate is n-doped silicon, whereby the first polarity thus is of n-type.

N-type or p-type conductivity may be achieved by suitable impurities present in the semiconductor materials of the semiconductor substrate.

In the example of FIG. 1, the semiconductor substrate 102 extends to the entire width of the semiconductor structure, i.e. it covers the entire area thereof. In other embodiments, a semiconductor substrate may cover only part of the area or width of a semiconductor structure.

The semiconductor substrate 102 has s front surface 103 defining a front side of the photodetector structure 100.

A "front" surface of the semiconductor substrate and the "front" side of the photodetector structure defined thereby refer to the surface of the semiconductor substrate, and the associated side of the photodetector substrate, on which surface and on which side the first dielectric layer with inducing net charge discussed below lies. Light or ionizing radiation to be detected may be incident on and received by the photodetector structure from the front side or from the opposite "back" side.

In the thickness direction, the main functions of the semiconductor structure 100 may be designed to take place in a region covering only a part of the thickness of the semiconductor structure. Such operational regions may lie, depending on the type of the semiconductor structure at issue and its designed operation, at different heights in the semiconductor structure, i.e. at different depths from a surface of the semiconductor structure. As discussed below, in the example of FIG. 1, such region lies close to the front surface 103 of the semiconductor substrate 102.

The semiconductor structure 100 further comprises a first dielectric layer 104 with inducing net charge of the first polarity on the semiconductor substrate.

"Dielectric layer" refers to a layer-formed structure, i.e. a structure extending in the lateral direction of the semiconductor structure, formed of a dielectric material. A dielectric layer may be formed, using any appropriate additive process, by adding a dielectric material on an existing surface of the semiconductor substrate. Alternatively, for example, an oxide layer as the dielectric layer may be formed by just introducing oxygen onto or in the semiconductor substrate, whereby part of the semiconductor substrate material and the oxygen may form an oxide layer. Lying "on" the semiconductor substrate does not necessitate the first dielectric layer lying directly on the semiconductor substrate, in direct contact with that, but there may be one or more intermediate layers therebetween.

The first dielectric layer may comprise, for example, an oxide. Especially in the case of the semiconductor structure 100 implemented as a photodetector structure, such oxide may be a transparent oxide, such as aluminum oxide $Al_2O_3$.

"Transparent" refers to the capability of a layer formed of a transparent oxide of transmitting a main portion of the light energy, at a relevant wavelength range, incident on such layer. In the case of a photodetector structure, the relevant wavelength range refers to the intended operation wavelengths of the photodetector structure. For example, a transparent layer may transmit 50% or more, e.g. 80% or more, of light energy at the relevant wavelength range incident on it. The higher the transparency is the higher sensitivity the photodetector structure may have.

"Net charge" refers to the overall sum of the charges in the first dielectric layer having the same first polarity, i.e. being of the same conductivity type, as the semiconductor substrate. Thus, with the semiconductor substrate having p-type or n-type conductivity, the net charge of the first dielectric layer is positive or negative, respectively.

The negative or positive net charge of the first dielectric layer may be an inherent property of the material of the first dielectric layer, or it may result inevitably from the manufacturing method thereof. It may also be adjustable by proper selection of the manufacturing process parameters.

For example, the resulting net charge of an oxide layer may depend on the surface pre-treatment before oxidation. Relevant factors include the actual cleaning method used, possible allowance of formation of native oxide, and possible chemical oxides resulting from cleaning. The resulting net charge also depends on the particulars of the oxide deposition process, such as the precursor materials, deposition and purge cycle durations, temperatures, etc. The net charge of the oxide layer may further be affected by post treatment of the deposited oxide layer, for example, by annealing and/or exposing to various pressures and atmospheres. $Al_2O_3$ mentioned above is an example of a dielectric material which inherently has, when produced by usual processes, negative net charge.

The expression "inducing" net charge refers to that an induced junction 105 is induced in the semiconductor substrate by an electric field E generated in the semiconductor substrate by the inducing net charge.

An "induced junction" is associated to an inversion layer or region formed in a semiconductor, induced by an external charge of the same conductivity type as the semiconductor. For example, when a dielectric layer with negative net charge, such as a layer of $Al_2O_3$, is formed on top of a substrate formed of n-type semiconductor, such as n-doped Si, the electric field generated in the substrate attracts holes towards, and repels electrons away from, the surface of the substrate on which the dielectric layer lies. If the field is strong enough and the doping concentration of the substrate is low enough, the holes will invert a thin layer of the substrate into p-type. Since the inversion layer and the bulk are in contact, they will effectively form a p-n junction and the system will behave as a diode. The same principle also applies for p-type substrates if the net charge of the dielectric layer is positive.

"Inversion" refers to a layer or region where the minority carrier concentration exceeds the majority carrier concentration. This may be called weak inversion limit. If the minority carrier concentration also exceeds the bulk doping concentration, strong inversion is achieved.

The net charge required to achieve an induced junction depends on the substrate carrier density. In case of a very high resistivity material with low carrier density, even less than a net charge of $1 \cdot 10^9$ e/cm3 may induce inversion. With resistivities more typical, for example, in solar industry, the lower limit may lie in the range of $1 \cdot 10^{11}$ e/cm3.

Thus, an induced junction may be formed in an n-type semiconductor substrate when sufficient external negative net charge attract the holes in the n-type semiconductor material of the substrate in such extent that inversion is created in the semiconductor substrate, resulting in an induced "p on n" junction, i.e. an induced junction.

Thus, instead of a conventional p-n junction based on two semiconductor regions with opposite conductivity types, an induced junction is formed within a single semiconductor substrate of a given conductivity type, induced by external charge, i.e. charge outside the semiconductor substrate, representing the same conductivity type as the semiconductor substrate. In the photodetector structure 100 of FIG. 1, such external charge suitable for forming the induced junction 105 in the semiconductor substrate 102 is provided by the inducing net charge of the oxide layer 104.

The induced junction 105, and the inversion layer 106 and the depletion region 107 associated to it, lie adjacent to the front surface 103 of the semiconductor structure 100. They together form an operational region 108, defined or observed in the thickness direction of the semiconductor substrate 100, in which operational region the main functions of the semiconductor structure 100, such as light sensing in the case of a photodetector or photovoltaic structure, are designed to take place.

An induced junction basically operates similarly and serves for the same purpose as conventional p-n junctions. In a photodetector structure, for example, the induced junction serves for the same purpose and function as a p-n junction in a conventional photodiode or other type of photodetector based on a p-n junction. Thus, free carriers generated in the semiconductor material of the semiconductor substrate via absorption of light may be collected to different sides of the induced junction and the depletion region thereof.

The induced junction 105 of the semiconductor substrate 100 may provide various advantages. For example, the induced junction 105 induced by the negative charge provided by the negatively charged oxide layer enables manufacturing and having a diode-type photodetector without need for ion implantation for a p-n junction, which typically increases recombination of the free charge carriers. Thus, for example, a photodetector structure with low surface recombination may be implemented. Further, the first dielectric layer providing the inducing net charge required to form the induced junction may also serve for efficient passivation of the surface of the semiconductor substrate 103.

In the example of FIG. 1, the first dielectric layer 104 covers substantially the entire front surface 103 of the semiconductor structure 100, i.e. it extends substantially to the entire width W of the semiconductor structure 100. Thus, the first dielectric layer does not lie in the operating area 101 only but extends outside it. In other embodiments, first dielectric layers extending outside the operating area of a semiconductor structure but not covering the entire front surface thereof may be used.

The semiconductor structure 100 of FIG. 1 further comprises, outside the operating area, a second dielectric layer 109. In the example of FIG. 1, the second dielectric area covers the entire front surface 103 of the semiconductor structure 100 except for the operating area 101. In other embodiments, a second dielectric layer may comprise different portions of the front surface of a semiconductor structure outside the operating area thereof. Also in such embodiments, the extension of the second dielectric layer may overlap or coincide with that of the first dielectric layer outside the operating area.

The second dielectric layer has compensating net charge of a second polarity opposite to the first polarity, the compensating net charge at least partially, possibly completely, compensating the electric field generated in the semiconductor substrate by the inducing net charge. "Oppositeness" of the second polarity refers to that in the case of the first polarity being of n-type or p-type, the second polarity is of p-type or n-type, respectively.

"Compensating" the electric field E generated by the inducing net charge refers to the compensating net charge of the second dielectric layer generating an opposite electric field E', resulting in decreased net electric field E" generated in the semiconductor substrate 103 by the first and the second dielectric layers in the area(s) where they both exist. The net electric field may be zero or even negative, i.e. have a direction opposite to that of the electric field E generated by the inducing net charge of the first dielectric layer.

Thereby, the photodetector structure is advantageously configured to confine the electric field E generated in the semiconductor substrate in the operating area 101. Consequently, with sufficient compensation lowering the net electric field E" below the limit creating the inversion, the inversion layer resulting in the formation of the induced junction is also confined in the operating area 101, i.e. substantially limited to extend there only. This may result many advantages in the operation and performance of the semiconductor structure.

First, confining the electrical field E in the operating area 101 makes the main function of the semiconductor structure, such as light sensing, take place spatially well controlled. Further, also undesired side effects such as lateral leakage of current through the edges of the semiconductor structure due to the presence of a current channel formed by the inversion layer may be avoided. The latter may improve the performance, in particular, in photodetector structures.

Similarly to the first dielectric layer, the negative or positive net charge of the second dielectric layer may be an inherent property of the material of the second dielectric layer, or it may result inevitably from the manufacturing method thereof. It may also be adjustable by proper selection of the manufacturing process parameters.

The second dielectric material may comprise, for example, an oxide such as silicon dioxide $SiO_2$. Silicon dioxide may be formed, for example, as a thermal oxide whereby it has inherently negative net charge. Silicon dioxide may thus be used to form a second dielectric material, for example, in the case with the first dielectric layer comprising aluminum oxide $Al_2O_3$.

In the example of FIG. 1, the second dielectric layer 109 lies between the first dielectric layer 104 and the semiconductor substrate 103. This may be a straightforward solution, for example, in the case the manufacturing process of the semiconductor structure 100 comprises forming a thermal oxide on the semiconductor substrate. It may then be sufficient to remove the thermal oxide from the operating area 101 of the semiconductor structure 100. In other embodiments, the first dielectric layer may lie between the second dielectric layer and the semiconductor substrate of a semiconductor structure.

Figure 2:
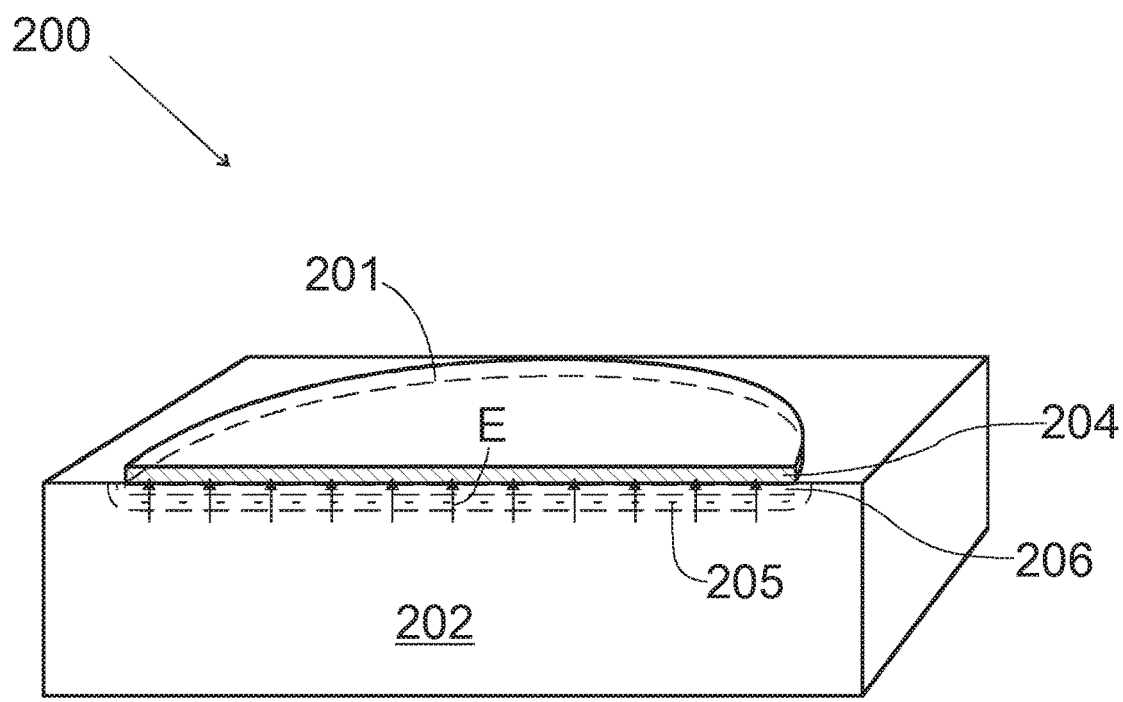

The semiconductor structure of FIG. 2 may be basically in accordance with any of those discussed above with reference to FIG. 1. It differs from those in that there is no second dielectric layer, and that the first dielectric layer 204 extends to, thus lies in, the operating area 201 only. The first dielectric layer is thereby "confined" in the operating area. In other embodiments, the first dielectric layer of a semiconductor structure may be "confined" in the operating area of the semiconductor substrate less strictly, i.e. possibly extending partially also outside it. Being "confined" in the operating area thus refers to the first dielectric layer lying, at least for a major part thereof, possibly entirely, in the operating area.

Said confinement of the extension of the first dielectric layer 204 makes the electric field E, generated in the semiconductor substrate 202 by the inducing net charge of the first dielectric layer 204, being confined in the operating area 201. Thus, instead of compensating the electric field generated by the first dielectric layer by another, opposite electric field, in the example of FIG. 2, the electric field is initially generated as being confined in the operating area 201.

The electric field E generated in the semiconductor substrate 202 being "confined" in the operating area 201 refers to the electric field resulting in formation of the inversion layer 206 being generated mainly, possibly entirely, in the operating area.

In the FIGS. 1 and 2, the semiconductor structures 100, 200 are illustrated without any contact structures or other layers or elements which a semiconductor structure may comprise in addition to the semiconductor substrate and first and possible second dielectric layers. Naturally, a semiconductor structure may comprise any appropriate additional layers and elements.

Figure 3:
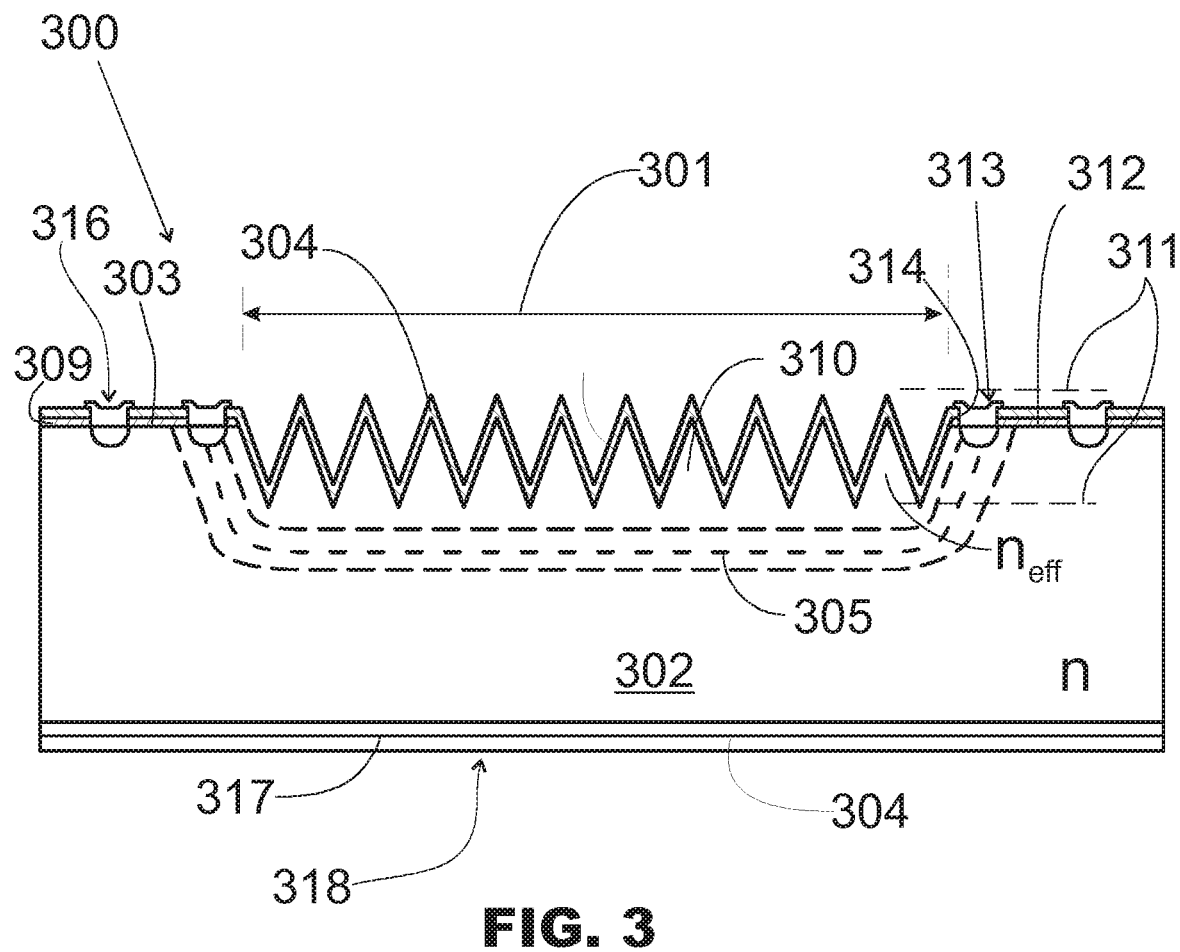
FIG. 3 illustrate a cross-sectional view of a photodetector structure.

The photodetector structure 300 of FIG. 3 may be basically in accordance with any of those discussed above with reference to FIG. 1.

The semiconductor substrate 302 of the semiconductor structure 300 of FIG. 3 has a bulk refractive index n.

Differently from the semiconductor structure 100 of FIG. 1, the front surface 303 of the semiconductor substrate 300 of the example of FIG. 3 comprises high aspect ratio nanostructures 310 extending substantially perpendicularly to the lateral direction, i.e. the direction of the width of the semiconductor structure.

"Nanostructure" refers to a structure having at least one characteristic dimension in the sub-micron range, i.e. equal to or less than a micrometer. From an optical point of view, such dimensions fall substantially in the range of, or below, the relevant detection wavelengths of typical photodetectors. As known for a skilled person, sub-wavelength features or features substantially in the range of the relevant wavelength may affect the propagation of light differently from a bulk material.

"High aspect ratio" nanostructures extending substantially vertically refer to structures having their height multiple times their lateral dimensions. Such nanostructures may comprise, for example, cylindrical or conical pillars, narrow pyramids, or inverse shapes thereof in the form of corresponding cavities.

The nanostructures 310 may have their average height in the direction perpendicular to the lateral direction in the range of 500 to 1500 nm, for example, about 600 or 800 to 1000 nm, and their average width in the horizontal direction in the range of 50 or 100 to 400 nm, for example, 200 to 300 nm.

The nanostructures 310 form an optical conversion layer 311 in which, due to the dimensions of the nanostructures in the range of or below the relevant wavelength range, the light behaves differently from the semiconductor substrate bulk material. The optical conversion layer has an effective refractive index $n_{eff}$ which gradually changes from the ambient refractive index of the material in contact with the nanostructures towards the bulk refractive index to reduce reflection of light incident on the photodetector structure from the front side thereof. For example, where the photodetector structure is designed to be used as exposed to ambient air with refractive index of 1, the effective refractive index may gradually change from 1 to the bulk refractive index. Thus, the average effective refractive index is set between the ambient and the bulk refractive indices.

"Effective refractive index" is an auxiliary definition related to interaction of light with a nanostructured material layer. Nanostructures in the range of or below the relevant wavelengths make the light behave in such a nanostructured layer differently from a corresponding layer of the same material without the nanostructures. This different behavior can be described by the auxiliary term "effective refractive index"; light behaves in, and interacts with, such nanostructured material layer as if the layer would be made of a gradually changing bulk material having, at each level of the conversion layer, a refractive index equal to the effective index at that level.

The semiconductor substrate 302 may comprise silicon which may be of n-type or p-type conductivity. In that case, the optical conversion layer 311 may comprise black silicon.

As known for those skilled in the art, "black silicon" refers to nanostructuring on a surface of silicon, producing an optical conversion layer having a gradually changing effective refractive index. Black silicon has been reported, for example, for use as an antireflection layer on a front surface of a p-type silicon solar cell having its p-n junction on the back side thereof; see e.g. Savin, H. et al., "Black silicon solar cells with interdigitated back-contacts achieve 22.1% efficiency", Nature Nanotechnology 10, 624-628 (2015). Similar construction may be implemented in photodiode type photodetector structure also.

In the example of FIG. 3, black silicon or an optical conversion layer with nanostructures of another type is utilized on the front surface of the semiconductor substrate 302, i.e. on the same side of the semiconductor structure as the induced junction 305 forming the actual active part of the semiconductor structure.

The optical conversion layer, possibly comprising black silicon, may improve the overall sensitivity of the photodetector structure via reduced reflection of light incident on the photodetector structure from the front side thereof. Advantageously, the anti-reflection performance of the optical conversion layer may have very low temperature dependence. Further, the optical conversion layer formed by the nanostructures may deepen the inversion layer in comparison to a flat front surface of the semiconductor substrate. This deepening may be achieved by the increased surface area of the semiconductor substrate, resulting in higher amount of the first dielectric layer material and the inducing net charge thereof on the semiconductor substrate, the higher amount of the inducing net charge in turn being capable of attracting more holes. Such deepening of the inversion layer may improve the performance of the induced junction.

Similarly to the photodetector structure 100 of FIG. 1, in the photodetector structure 300 of FIG. 3, the first dielectric layer 304 lies on the front surface 303 of the semiconductor substrate 302. It covers substantially conformally, i.e. follows with substantially uniform layer thickness, the nanoctructures 310. Such conformal coating may be achieved, for example, by forming the first dielectric layer by atomic layer deposition ALD.

As discussed above with reference to FIG. 1, the first dielectric layer 304 may comprise, for example, a transparent oxide such as aluminum oxide $Al_2O_3$ or any other suitable transparent oxide layer with sufficient inducing net charge to induce the induced junction 305.

As in the photodetector structure 100 of FIG. 1, outside the operating area 301, a second dielectric layer 309 is positioned between the semiconductor substrate 302 and the first dielectric layer 304, and has compensating net charge of a second polarity opposite to the first polarity of the first dielectric layer and the majority charge carriers of the semiconductor substrate. Thereby, the electric field E generated in the semiconductor substrate 302 is confined in the operating area.

In other embodiments, photodetector structures may be implemented which are otherwise similar to any of those discussed above with reference to FIG. 3 but wherein, instead of a second dielectric layer, the first dielectric layer is confined in the operating area in accordance with the semiconductor structure 200 of FIG. 2.

In the photodetector structure 300 of FIG. 3, the nanostructures 310 and the optical conversion layer 311 formed thereby exist in the operating area 301 only.

Outside the operating area 301, the front surface 303 of the semiconductor substrate 302 has a circumferential nonstructured, flat area 312 which is free of the nanostructures. Electrically conductive circumferential front contact 313, serving as an anode/cathode contact of the photodetector structure, is formed in the flat area, in circumferential opening 314 formed through the first and the second dielectric layers 304, 309. The front contact extends through the front surface 303 of the semiconductor substrate 302 to an upper part of the semiconductor substrate above the induced junction 305.

Figure 5:
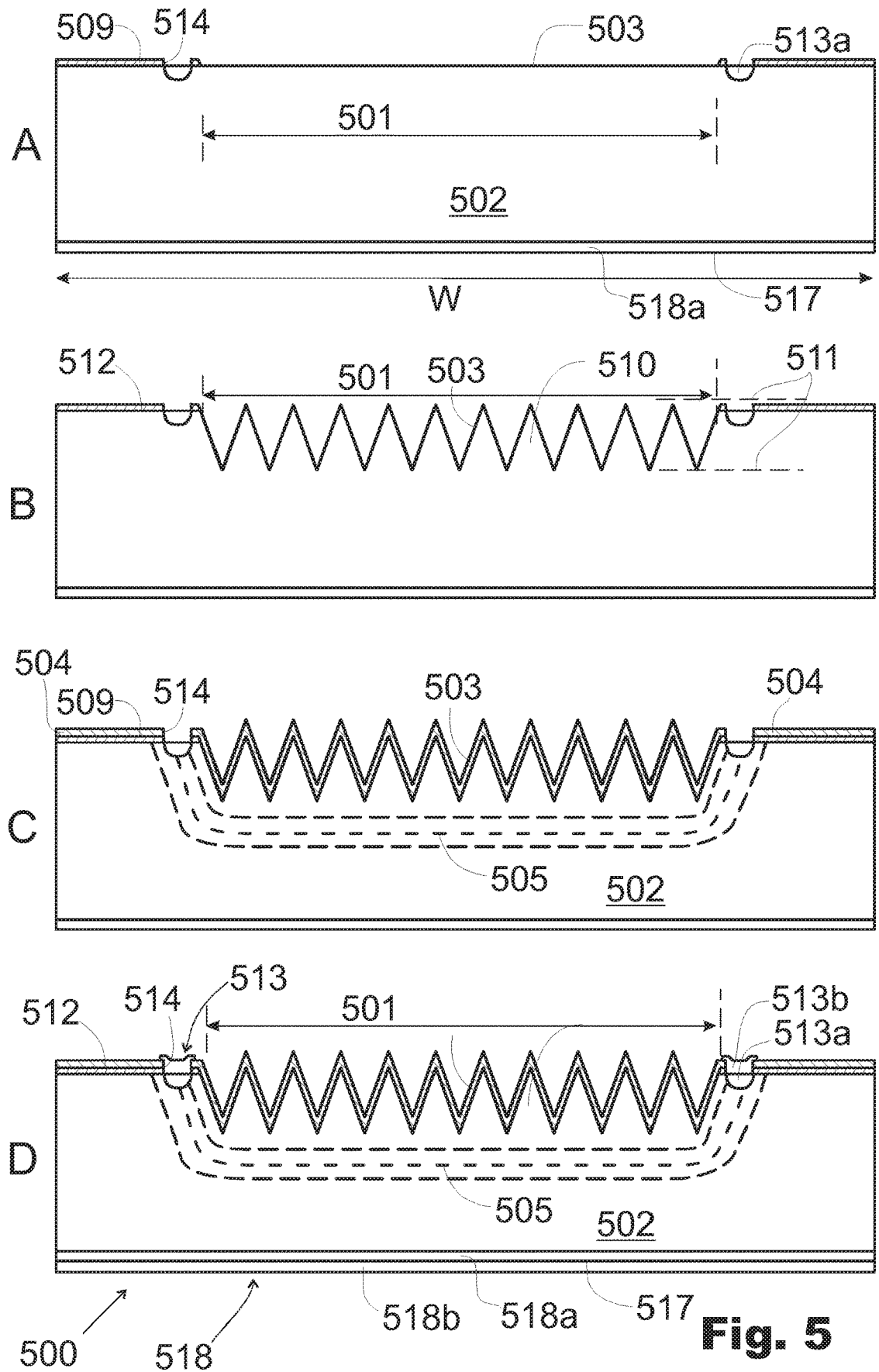
FIG. 5 illustrates a method of manufacturing a photodetector structure.

An additional circumferential contact 316 serving as a guard ring is formed, possibly similarly to the formation of the front contact 313 on the flat area 312, between the front contact 313 and the edges of the semiconductor structure 300. A "guard ring" refers to a circumferential or annular contact structure encircling the associated anode or cathode contact. The presence of a guard ring may be used to collect leakage current which might otherwise flow across the photodetector structure edges, disturbing the light generated current collected from the anode contact. In other embodiments, photodetectors without any guard ring may be implemented. One such example is illustrated in FIG. 5.

In other embodiments, instead of a continuous, circumferential flat area and respective circumferential opening(s) in the oxide layer and circumferential front contact and possible guard ring, there may be any number of discrete flat areas and respective discrete openings and contacts at different locations of a photodetector structure.

The semiconductor substrate 302 has a back surface 317 opposite to the front surface 304, and an electrically conductive back contact 318, serving as a cathode/anode contact of the photodetector structure, is formed on and adjacent to the back surface.

The front and the back contacts 313, 318 may be made, for example, as comprising a metal and/or any other suitable material with sufficiently high electrical conductivity. The front and the back contacts provide means for connecting the photodetector to an external circuitry. Such external circuitry may be used for biasing the induced junction 305 if needed, and for collecting the electrical signal(s) generated in response to absorption of light in the photodetector structure 300.

In other embodiments, instead of a continuous back contact layer, a photodetector structure may comprise any number of discrete back contact elements or structures.

Further, in yet other embodiments, instead of one single continuous cathode/anode contact or a plurality of discrete cathode/anode contacts formed on the back surface of the semiconductor substrate, one or more cathode/anode contacts may be formed on the front surface thereof also. Thus, embodiments are possible with both anode/cathode contact(s) and cathode/node contact(s) lying on the front surface of the semiconductor substrate.

To improve the back contact performance and current spreading at the back surface of the semiconductor substrate, the semiconductor substrate may comprise, for example, a back surface layer having higher conductivity than the rest of the semiconductor substrate. Correspondingly, doping of appropriate polarity/conductivity type may be arranged close to the front surface of the semiconductor substrate to improve the contact between the front side contacts and the inversion region or layer. The structures of front and back contacts are discussed in more detail below with reference to FIG. 5.

Front and back contact structures in accordance with those discussed above may be also present in photodetector structures in accordance with those discussed above with reference to FIGS. 1 and 2. In the case of a semiconductor structure having no nanostructures on the front surface of the semiconductor substrate, no specific flat areas are needed because front contacts may be formed anywhere in the substantially flat front surface of the semiconductor substrate, naturally taking into account the desired performance and designed way of operation of the semiconductor structure.

Above, mainly structural and material aspects of photodetector structures are discussed. In the following, more emphasis will lie on manufacturing aspects related to photodetector structures. What is said above about the ways of implementation, definitions, details, and advantages related to the structural and material aspects apply, mutatis mutandis, to the method aspects discussed below. The same applies vice versa.

The method 400 of FIG. 4 may be used to manufacture a semiconductor structure with a width in a lateral direction, having an operating area covering part of the width of the semiconductor structure. Such semiconductor substrate may be in accordance with any of those discussed above with reference to FIGS. 1 and 2.

The method 400 starts by providing, in operation 401, a semiconductor substrate with majority charge carriers of a first polarity. The first polarity may be n-type of p-type. The semiconductor substrate may be formed of any appropriate elemental semiconductor such as silicon Si or germanium Ge, or compound semiconductor such as gallium arsenide GaAs or gallium nitride GaN, or any appropriate derivative thereof. In one embodiment, the semiconductor substrate s formed of n-type silicon.

A second dielectric layer is formed, in step 402, on the semiconductor substrate outside the operating area. The second dielectric layer has a compensating net charge of a second polarity which is opposite to the first polarity.

In operation 403, the method comprises forming a first dielectric layer with inducing net charge of the first polarity on the semiconductor substrate and actually also on the second dielectric layer already lying thereon. The first dielectric may comprise or be formed of, for example, an oxide, for example, a transparent oxide such as aluminum oxide $Al_2O_3$. Aluminum oxide with negative net charge may be used, for example, in the case of the semiconductor substrate formed of n-type silicon. Then, the second dielectric layer may comprise, for example, silicon dioxide $SiO_2$ which inherently has positive net charge. Silicon dioxide may then me formed, for example, as thermal oxide. Other possible oxides may be, for example, hafnium oxide $HfO_2$n titanium oxide $TiO_2$, and zinc oxide ZnO. Instead of an oxide, the first dielectric layer may comprise, or it may be completely formed of, a nitride such as titanium nitride TiN.

In the example of FIG. 4, the second dielectric layer is formed on the semiconductor substrate before the first dielectric layer so that in the completed semiconductor structure, the second dielectric layer lies between the semiconductor substrate and the first dielectric layer. In other embodiments, the first dielectric layer may be formed on the semiconductor substrate before the second dielectric layer, whereby the order of the first and the second dielectric layers in the completed structure may be the opposite.

The conductivity of the semiconductor substrate and the inducing net charge of the first dielectric layer are selected and adjusted so that an induced junction is induced in the semiconductor substrate by an electric field generated in the semiconductor substrate by the inducing net charge.

Further, the compensating net charge of the second dielectric layer is selected and adjusted so that outside the operating area, the compensating net charge of the second dielectric layer at least partially compensates the electric field generated in the semiconductor substrate by the inducing net charge of the first dielectric layer. Thereby, the photodetector structure is formed so as to confine the electric field generated in the semiconductor substrate in the operating area of the semiconductor structure.

In other embodiments, methods may be used in which no second dielectric layer is formed, or in which such layer is removed after having formed. Then, the confinement of the electric field generated in the semiconductor substrate in the operating area may be achieved by forming the first dielectric layer so as to be confined in the operating area.

The method of FIG. 5 may be used for manufacturing a photodetector structure 500 which may be, for example, basically in accordance with that discussed above with reference to FIG. 3. The photodetector structure 500 of FIG. 5 does not comprise, however, any guard ring.

The method starts by providing a semiconductor substrate 502 with a width W in a lateral direction, having a bulk refractive index and a front surface 503 which defines a front side of the photodetector structure.

In the example of FIG. 5, the semiconductor is of n-type conductivity. In other embodiments, semiconductor substrates with p-type conductivity may be used.

The semiconductor substrate may be formed as a substrate for one single photodetector structure. Alternatively, it may comprise an integral substrate structure for a plurality of photodetector structures.

As first actual action of the method, in operation A, a circumferential p+ doped region 513a is formed in the semiconductor substrate as extending from the front surface 503 to a predetermined depth into the semiconductor substrate. The p+ doped region may be formed, for example, by implantation of suitable ions into the semiconductor substrate. Ion implantation may be followed by annealing in an elevated temperature. Further, an n+ doped surface layer 518a is formed in the semiconductor substrate adjacent to the back surface 517 thereof. Similarly to the p+ doped region of the front contact, the n+ doped region may be formed, for example, by ion implantation, possibly followed by annealing. As discussed above with reference to FIG. 3, in other embodiments, instead of a back contact, also a contact to the bulk substrate may be formed on the front surface of the semiconductor substrate.

In forming the circumferential p+ doped region 513a, a layer 509 of thermal oxide formed on the front surface 503 of the semiconductor substrate is used as a mask layer for the ion implantation. After forming the p+ doped region 513a via a circumferential opening 514 formed through the thermal oxide, the thermal oxide is left at the edge area of the semiconductor structure, i.e. outside a central area 501 designed to form the operating area of the completed semiconductor structure. This remaining thermal oxide forms the "second dielectric layer" in the completed semiconductor structure.

The purpose of the p+ doped region 513a and the n+ doped surface layer 518a is to serve as part of the front/anode and back/cathode contact, respectively, of the completed photodetector structure.

In other embodiments, simultaneously with formation of the front contact, also a guard ring similar to that of the photodetector 300 of FIG. 3 may be formed.

The front surface 503 of the semiconductor substrate 502 is structured, in operation B, so as to form substantially vertically extending high aspect ratio nanostructures 510 thereon. Thereby, an optical conversion layer 511 is formed, having an effective refractive index gradually changing towards the bulk refractive index to reduce reflection of light incident on the photodetector structure from the front side thereof.

In structuring the front surface of the semiconductor substrate, any suitable known techniques and processes may be used. For example, high aspect ratio nanostructures may be formed by laser texturization, plasma immersion ion implantation, metal-assist wet etching, or cryogenic deep reactive ion etching (DRIE). In the embodiment illustrated in FIG. 5, structuring is applied on the central area 501 of the semiconductor structure 500 only, thereby leaving a flat area 512 at the peripheral area of the front surface non-structured, i.e. without nanostructures. The flat area and the p+ doped region 513a are aligned so that the p+ doped region lies on the area of the flat area 512.

Depending on the technique used for structuring the front surface of the semiconductor substrate, various alternative approaches may be used to leave the flat area 512 without structuring. In some techniques, such as laser texturization, it may be sufficient to control the structuring spatially so that no structuring is applied on area(s) for flat area(s). On the other hand, for example, in techniques comprising etching the front surface of the semiconductor substrate, a mask layer may be formed on the front surface of the semiconductor substrate, the mask layer comprising a mask region and an open region. Such mask layer may prevent formation of the high aspect ratio nanostructures on the front surface of the semiconductor substrate below the mask region during etching. Thereby, a flat area remains below each mask region, and a front contact may then be formed thereon after removal of the mask layer.

In operation C, external negative charge is provided on the front surface of the semiconductor substrate so as to induce an induced junction 505 in the semiconductor substrate. In the embodiment illustrated in FIG. 5, the external charge is provided by forming an additional dielectric layer 504 having a negative net charge, on the front surface of the semiconductor substrate and the thermal oxide lying thereon. In completed semiconductor structure 500, this layer forms the "first dielectric layer".

In one embodiment, the semiconductor substrate provided in operation A comprises n-type silicon, and the conversion layer 511 is formed in operation B so as to comprise black silicon.

With n-type silicon as the material of the semiconductor substrate, in one embodiment, providing the external negative charge comprises forming a transparent oxide layer with a negative net charge, the oxide layer covering substantially conformally the front surface of the semiconductor substrate with the nanoctructures. In this embodiment, the induced junction 505 is induced by the negative net charge of the oxide layer as the additional dielectric layer 504. The oxide layer with negative net charge may comprise, for example, aluminum oxide $Al_2O_3$.

The oxide layer comprising aluminum oxide may be formed, for example, by atomic layer deposition ALD.

"Atomic layer deposition", sometimes called atomic layer epitaxy ALE, refers to a process, wherein a substrate is alternately exposed to at least two precursors, one precursor at a time, to form on the substrate a coating by alternately repeating essentially self-limiting surface reactions between the surface of the substrate (on the later stages, naturally, the surface of the already formed coating layer on the substrate) and the precursors. As a result, the coating material is "grown" on the substrate molecule layer by molecule layer. This enables accurate and well controlled production of thin film coatings.

In the above embodiment, ALD enables forming the oxide layer with well-defined thickness and excellent conformity with the nanostructured front surface of the semiconductor substrate.

After initially forming the additional layer 504 over the entire front surface 503 of the semiconductor substrate 502, the circumferential opening 514 initially extending through the thermal oxide layer 509 is made exist through the additional dielectric layer 504 also.

To finalize the contacts of the photodetector structure, the method illustrated in FIG. 5 further comprises, in operation D, completing an electrically conductive front contact 513 in the circumferential opening 514, the front contact extending through the front surface 503 of the semiconductor substrate 502 in the flat area 512 to an upper part of the of the semiconductor substrate above the induced junction 505.

Further, an electrically conductive back contact 518 on and adjacent to the back surface 517 of the semiconductor substrate 502 is also completed in operation D.

The front and the back contacts may be, for example, in accordance with the front and back contacts discussed above with reference to FIG. 3.

In the embodiment illustrated in FIG. 5, said completing of the front contact comprises forming a circumferential metal pad 513b on the p+ doped region 513a. Thus, the completed front contact 513 comprises the p+ doped region 513a in the upper part of the semiconductor substrate, and the metal pad 513b on the p+ doped region.

Said completing of the back contact 518, in turn, comprises forming a metal layer 518b on the n+ doped surface layer 518a formed in the semiconductor substrate adjacent to the back surface 517 thereof. Thus, the completed back contact 518 comprises the metal layer 518b, and the n+ doped surface layer 518a of the semiconductor substrate 502.

The metal pad 513b and the metal layer 518b may be formed, for example, by sputtering aluminum or some other suitable contact metal.

In other embodiments, different types and configurations of the front and back contacts may be formed and present in a photodetector structure. In particular, similarly to what was discussed above with reference to FIG. 3, contact layouts may be formed which are different from one or more circumferential front contacts and a continuous back contact layer.

Further, it is to be noted that the above operations for forming the front and back contacts represent one example only. In other embodiments, any other appropriate processes may be used to form the contacts. For example, not limiting the range of potential processes, various laser-aided processing methods may be used in forming the contacts, such as laser transfer of metal contacts and dopants, or laser induced chemical vapor deposition of metals. Using processes other than that discussed above with reference to FIG. 5, the contacts may be formed at any appropriate phases of the overall manufacturing process.

In any of the embodiments discussed above, the semiconductor substrate may have a thickness in the vertical direction, for example, in the range of 100 or 200 to 500 µm. The thickness should be high enough to ensure sufficiently large portion of incident light is absorbed within the substrate. In embodiments were the external charge is provided by an oxide layer such as an oxide layer comprising aluminum oxide $Al_2O_3$, the oxide layer thickness may be, for example, in the range of some tens of nanometers.

In the above, aspects are discussed concerning photodetector structures and photodetectors. However, in other embodiments, structures and devices as those which are above referred to photodetectors or photodetector structures may be used for detecting electromagnetic radiation also outside the visible part of the electromagnetic spectrum, and also particle radiation. In this sense, all what is stated above concerning photodetectors and photodetector structures apply, mutatis mutandis, also more generally to radiation detectors and radiation detector structures for detecting electromagnetic radiation or particle radiation, including ionizing radiation.

Suitable detecting performance for such other types of radiation may be achieved, for example, by biasing the detector structure with higher voltage than that used for photodetector operation.

The (optical) conversion layer, or a layer of black silicon, may provide advantages also in the case of electromagnetic radiation outside the visible spectrum and/or particle radiation. For example, in such layer, the surface area is multiple in comparison to a flat surface, so much higher charge may be created, resulting in deeper induction, in turn resulting in better conductivity, which is advantageous in any detector application.

Some aspects are further discussed shortly in the following.

In a first aspect, a layered semiconductor structure with a width in a lateral direction, having an operating area covering part of the width of the semiconductor structure, comprises: a semiconductor substrate with majority charge carriers of a first polarity; and a first dielectric layer with inducing net charge of the first polarity on the semiconductor substrate; an induced junction (105) being induced in the semiconductor substrate by an electric field generated in the semiconductor substrate by the inducing net charge; the semiconductor structure being configured to confine the electric field generated in the semiconductor substrate in the operating area.

In an embodiment, the first polarity is of n-type.

In an embodiment in accordance with the previous embodiment, the semiconductor substrate is formed of silicon.

In an embodiment, which may be in accordance with any of the preceding embodiments, the first dielectric layer comprises a transparent oxide.

In an embodiment in accordance with the previous embodiment, the transparent oxide is aluminum oxide $Al_2O_3$.

In an embodiment, which may be in accordance with any of the preceding embodiments, the first dielectric layer extends outside the operating area, and the semiconductor structure further comprises, outside the operating area, a second dielectric layer with compensating net charge of a second polarity opposite to the first polarity, the compensating net charge at least partially compensating the electric field generated in the semiconductor substrate by the inducing net charge.

In an embodiment in accordance with the previous embodiment, the second dielectric layer lies between the first dielectric layer and the semiconductor substrate.

In an embodiment, which may be in accordance with any of the two previous embodiments, the first polarity is of n-type, and the second dielectric layer comprises silicon dioxide $SiO_2$.

In an embodiment, which may be in accordance with any of the four first embodiments above, the first dielectric layer is confined in the operating area.

In an embodiment, which may be in accordance with any of the preceding embodiments, the layered semiconductor structure is implemented as a photodetector, the operating area being an active area for receiving and absorbing light to be detected.

In an embodiment in accordance with the previous embodiment, wherein the semiconductor substrate has a bulk refractive index and a front surface defining a front side of the photodetector structure, the first dielectric layer lying on the front surface; the front surface comprises high aspect ratio nanostructures extending substantially perpendicularly to the lateral direction, the nanostructures forming an optical conversion layer having an effective refractive index gradually changing towards the bulk refractive index to reduce reflection of light incident on the photodetector structure from the front side thereof; the first dielectric layer covering substantially conformally the nanostructures.

In a second aspect, a method for manufacturing a semiconductor substrate with a width in a lateral direction, having an operating area covering part of the width of the semiconductor structure, comprises: providing a semiconductor substrate with majority charge carriers of a first polarity; and forming a first dielectric layer with inducing net charge of the first polarity on the semiconductor substrate; an induced junction being induced in the semiconductor substrate by an electric field generated in the semiconductor substrate by the inducing net charge; the semiconductor structure being formed so as to confine the electric field generated in the semiconductor substrate in the operating area.

In an embodiment of the second aspect, the first polarity is of n-type.

In an embodiment of the second aspect in accordance with the previous embodiment, the semiconductor substrate is formed of silicon.

In an embodiment of the second aspect, which may be in accordance with any of the preceding embodiments of the second aspect, the first dielectric layer is formed so as to comprise a transparent oxide.

In an embodiment of the second aspect in accordance with the previous embodiment, the transparent oxide is aluminum oxide $Al_2O_3$.

In an embodiment of the second aspect, which may be in accordance with any of the preceding embodiments of the second aspect, the first dielectric layer is formed so as to extend outside the operating area, and the method further comprises forming, outside the operating area, a second dielectric layer with compensating net charge of a second polarity opposite to the first polarity, the compensating net charge at least partially compensating the electric field generated in the semiconductor substrate by the inducing net charge.

In an embodiment of the second aspect in accordance with the previous embodiment, the second dielectric layer is formed so as to lie between the first dielectric layer and the semiconductor substrate.

In an embodiment of the second aspect, which may be in accordance with any of the two previous embodiments, the first polarity is of n-type, and the second dielectric layer is formed so as to comprise silicon dioxide $SiO_2$.

In an embodiment of the second aspect, which may be in accordance with any of the four first embodiments of the second aspect above, the first dielectric layer is formed so as to be confined in the operating area.

In an embodiment, which may be in accordance with any of the preceding embodiments of the second aspect, the layered semiconductor structure is implemented as a photodetector, the operating area being an active area for receiving and absorbing light to be detected.

In an embodiment of the second aspect, which may be in accordance with any of the preceding embodiments of the second aspect, wherein the semiconductor substrate has a bulk refractive index and a front surface defining a front side of the photodetector structure, the first dielectric layer being formed on the front surface; the method comprising forming, on the front surface of the semiconductor substrate, substantially vertically extending high aspect ratio nanostructures forming an optical conversion layer having an effective refractive index gradually changing towards the bulk refractive index to reduce reflection of light incident on the photodetector structure from the front side thereof; the first dielectric layer being formed so as to cover substantially conformally the nanoctructures.

In an embodiment of the second aspect in accordance with the previous embodiment, the first dielectric layer is formed by atomic layer epitaxy ALD.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The term "comprising" is used in this specification to mean including the feature(s) or act(s) followed thereafter, without excluding the presence of one or more additional features or acts.

The invention claimed is:

1. A layered semiconductor structure with a width in a lateral direction, having an operating area covering part of the width of the semiconductor structure, the semiconductor structure comprising:
    a semiconductor substrate with majority charge carriers of a first polarity; and
    a first dielectric layer with inducing net charge of the first polarity on the semiconductor substrate;
an induced junction being induced in the semiconductor substrate by an electric field generated in the semiconductor substrate by the inducing net charge;
the semiconductor structure being configured to confine the electric field generated in the semiconductor substrate in the operating area,
wherein the first dielectric layer extends outside the operating area, and the semiconductor structure further comprises, outside the operating area, a second dielectric layer with compensating net charge of a second polarity opposite to the first polarity, the compensating net charge at least partially compensating the electric field generated in the semiconductor substrate by the inducing net charge.

2. A semiconductor structure as defined in claim 1, wherein the first polarity is of n-type.

3. A semiconductor structure as defined in claim 2, wherein the semiconductor substrate is formed of silicon.

4. A semiconductor substrate as defined in claim 1, wherein the first dielectric layer comprises a transparent oxide.

5. A semiconductor substrate as defined in claim 4, wherein the transparent oxide is aluminum oxide $Al_2O_3$.

6. A semiconductor structure as defined in claim 1, wherein the second dielectric layer lies between the first dielectric layer and the semiconductor substrate.

7. A semiconductor structure as defined in claim 1, wherein the first polarity is of n-type, and the second dielectric layer comprises silicon dioxide $SiO_2$.

8. A semiconductor structure as defined in claim 1, wherein the first dielectric layer is confined in the operating area.

9. A semiconductor structure as defined in claim 1, implemented as a photodetector, the operating area being an active area for receiving and absorbing light to be detected.

10. A semiconductor structure as defined in claim 9, wherein the semiconductor substrate has a bulk refractive index and a front surface defining a front side of the photodetector structure, the first dielectric layer lying on the front surface; the front surface comprising high aspect ratio nanostructures extending substantially perpendicularly to the lateral direction, the nanostructures forming an optical conversion layer having an effective refractive index gradually changing towards the bulk refractive index to reduce reflection of light incident on the photodetector structure from the front side thereof; the first dielectric layer covering substantially conformally the nanostructures.

11. A method for manufacturing a semiconductor substrate with a width in a lateral direction, having an operating area covering part of the width of the semiconductor structure, the method comprising:

providing a semiconductor substrate with majority charge carriers of a first polarity; and forming a first dielectric layer with inducing net charge of the first polarity on the semiconductor substrate;

an induced junction being induced in the semiconductor substrate by an electric field generated in the semiconductor substrate by the inducing net charge;

the semiconductor structure being formed so as to confine the electric field generated in the semiconductor substrate in the operating area, wherein the first dielectric layer is formed so as to extend the operating area, and the method further comprises forming, outside the operating area, a second dielectric layer with compensating net charge of a second polarity opposite to the first polarity, the compensating net charge at least partially compensating the electric field generated in the semiconductor substrate by the inducing net charge.

12. A method as defined in claim 11, wherein the semiconductor substrate has a bulk refractive index and a front surface defining a front side of the photodetector structure, the first dielectric layer being formed on the front surface; the method comprising forming, on the front surface of the semiconductor substrate, substantially vertically extending high aspect ratio nanostructures forming an optical conversion layer having an effective refractive index gradually changing towards the bulk refractive index to reduce reflection of light incident on the photodetector structure from the front side thereof; the first dielectric layer being formed so as to cover substantially conformally the nanoctructures.

13. A method as defined in claim 12, wherein the first dielectric layer is formed by atomic layer epitaxy ALD.

* * * * *